United States Patent [19]

McKinney

[11] 4,117,322

[45] Sep. 26, 1978

[54] ION SCATTERING SPECTROMETER INCLUDING CYLINDRICAL MIRROR ANALYZER AND ION GUN AXIALLY POSITIONED THEREWITHIN

[75] Inventor: James T. McKinney, Stillwater, Minn.

[73] Assignee: Minnesota Mining and Manufacturing Company, Saint Paul, Minn.

[21] Appl. No.: 855,307

[22] Filed: Nov. 28, 1977

Related U.S. Application Data

[63] Continuation of Ser. No. 712,678, Aug. 9, 1976, abandoned.

[51] Int. Cl.² ............................................. G01N 23/00
[52] U.S. Cl. ................................... 250/309; 250/281
[58] Field of Search .............. 250/309, 281, 282, 292, 250/305

[56] References Cited

U.S. PATENT DOCUMENTS 3,818,228  6/1974  Palmberg .......................... 250/305
3,935,453  1/1976  Liebl ................................ 250/292

Primary Examiner—Harold A. Dixon
Attorney, Agent, or Firm—Cruzan Alexander; Donald M. Sell; William B. Barte

[57] ABSTRACT

An improved ion scattering spectrometer (ISS) in which a cylindrical mirror analyzer is provided and an ion gun for providing a beam of noble gas ions which are impinged upon and elastically scattered from a surface to be analyzed is axially positioned within the inner cylinder of the analyzer. A detector for ions passed through the analyzer is axially positioned proximate an energy resolving aperture located at the conjugate point of ions scattered from the sample to thereby detect ions having a narrow energy pass band. The analyzer has a substantially uniform response over a target area that is at least a thousand times the cross-sectional area of the ion beam impinged upon the target so that elemental imaging of the surface can be accomplished.

10 Claims, 4 Drawing Figures

ION SCATTERING SPECTROMETER INCLUDING CYLINDRICAL MIRROR ANALYZER AND ION GUN AXIALLY POSITIONED THEREWITHIN

This is a continuation of application Ser. No. 712,678 filed Aug. 9, 1976, now abandoned.

BACKGROUND OF THE INVENTION

1. Field of the Invention

This invention relates to ion scattering spectrometers in which the surface of a target to be analyzed is bombarded with a beam of monoenergetic ions and the mass of atoms on the surface is determined from a measurement of the loss of energy of ions thereupon scattered from the surface.

2. Description of the Prior Art

U.S. Pat. No. 3,480,774 (Smith) assigned to the assignee of the present invention and from which the present invention is a direct descendant, describes the original basis for what has now become an important commercial technique of surface analysis, i.e., ion scattering spectroscopy (ISS). Since the issuance of that initial patent, in which a large, cumbersome and expensive apparatus was described, numerous improvements have been made in which the size and expense of ISS systems has been decreased, while nevertheless providing gains in sensitivity, resolution, convenience and broader applicability. See, for example, U.S. Pat. Nos. 3,665,182 (Goff and Smith), 3,665,185 (Goff), 3,916,190 (Valentine and Goff), 3,916,191 (Leys and Goff) and 3,920,989 (Erickson and Smith), all of which patents are assigned to the same assignee as the present application.

Similarly, the increasing commercial acceptance of ISS has spurred the activities of other investigators and has thereby promoted the progress of this technology. For example, U.S. Pat. No. 3,920,990 (Nieuwland et al) depicts an ISS device in which a cylindrical mirror analyzer is provided with an annular entrance diaphragm. Such a configuration is said to enable the acceptance into the analyzer of as many as 180 times as many ions as were accepted into the analyzer described in U.S. Pat. No. 3,480,774 (Smith).

In that device, the ion gun is axially positioned external to the analyzer such that the incident ion beam passes axially through the entire analyzer. Scattered ions are then detected by a concentric annular detector which is presumably shielded from the incident ion beam but appears not to be positioned for minimum trace width and hence may significantly degrade the performance of the analyzer. The long ion trajectories and attendent problems associated with focusing and with space charge spreading make it difficult to reduce the diameter of the resultant beam. Similarly, magnetic filters, such as the Wien filter there disclosed must be shielded from the analyzer to avoid distortion of ion trajectories therewith.

In order to permit surface analysis of a smaller size with ISS systems, further attention has been directed to the development of improved ion sources. One such source is disclosed in U.S. Pat. No. 3,937,958 (Rusch and Sievers), which patent is also assigned to the assignee of the present invention, and is said to be usable in an ISS such as that disclosed in U.S. Pat. No. 3,665,182 (Goff and Smith).

SUMMARY OF THE INVENTION

The present invention includes in a device for analyzing a surface layer by means of ion scattering spectroscopy, a cylindrical mirror analyzer having a compact ion source such as an electron bombardment type ion gun axially positioned therewithin and an ion detector means axially positioned adjacent an energy resolving aperture plate positioned at the conjugate focal point of ions scattered from the target surface. In the device of the present invention, the ion source produces a beam of primary ions having substantially a single mass and a single energy directed along an axis of symmetry towards a target placed at a predetermined position on the axis, the surface of which target is to be analyzed. The cylindrical mirror analyzer of the device comprises inner and outer cylindrical electrodes electrically insulated from each other, which electrodes are coaxially positioned on the beam axis and define a zone of substantially radial electric field when a potential is applied between the electrodes. The inner cylindrical electrode includes an annular entrance aperture positioned to allow ions scattered from the surface at a predetermined angle to enter into the radial field zone and to be deflected thereby. The inner cylindrical electrode also includes an annular exit aperture positioned to allow the deflected ions to pass therethrough out of the radial field zone. Accordingly, those ions having a preselected energy are focused upon an axially located conjugate focal point for ions scattered from the target when a given potential is applied to the cylindrical electrodes.

As previously suggested, the ion beam producing means is axially positioned within the inner cylindrical electrode and comprises a plurality of substantially cylindrical members. In a preferred embodiment, the ion beam producing means comprises, arranged in axial sequence, an ion generator, having a source of charged particles and a primary extractor electrode, a first focusing lens, a diameter limiting electrode and a second focusing lens. Such an apparatus permits the generation of a substantially monoenergetic beam which can be focused to a very small diameter under one set of operating conditions and which under another set of operating conditions can be focused to provide a high current beam of large diameter. In the former condition, the area of the bombarded spot on the target can be as small as 0.1% of the area over which the analyzer has substantially uniform response. In this way, this device is capable of elemental imaging and improved depth profiling by selecting only the center of the resultant crater for analyzing. The internal placement of the ion gun removes the restrictions of the prior art device discussed hereinabove, on the positioning of the energy resolving aperture and enables the axial placement of the detector. Similarly, this placement permits a high efficiency continuous dynode electron multiplier detector to be used. The compact and versatile operation of the ISS device of the present invention enables the device to be provided as an add-on device to be used with existing vacuum systems, and offers the expanded capability of ISS, depth profile analysis and secondary ion mass spectroscopy (SIMS) at improved sensitivity and resolution over prior art devices.

DESCRIPTION OF THE PREFERRED EMBODIMENTS

Figure 1:
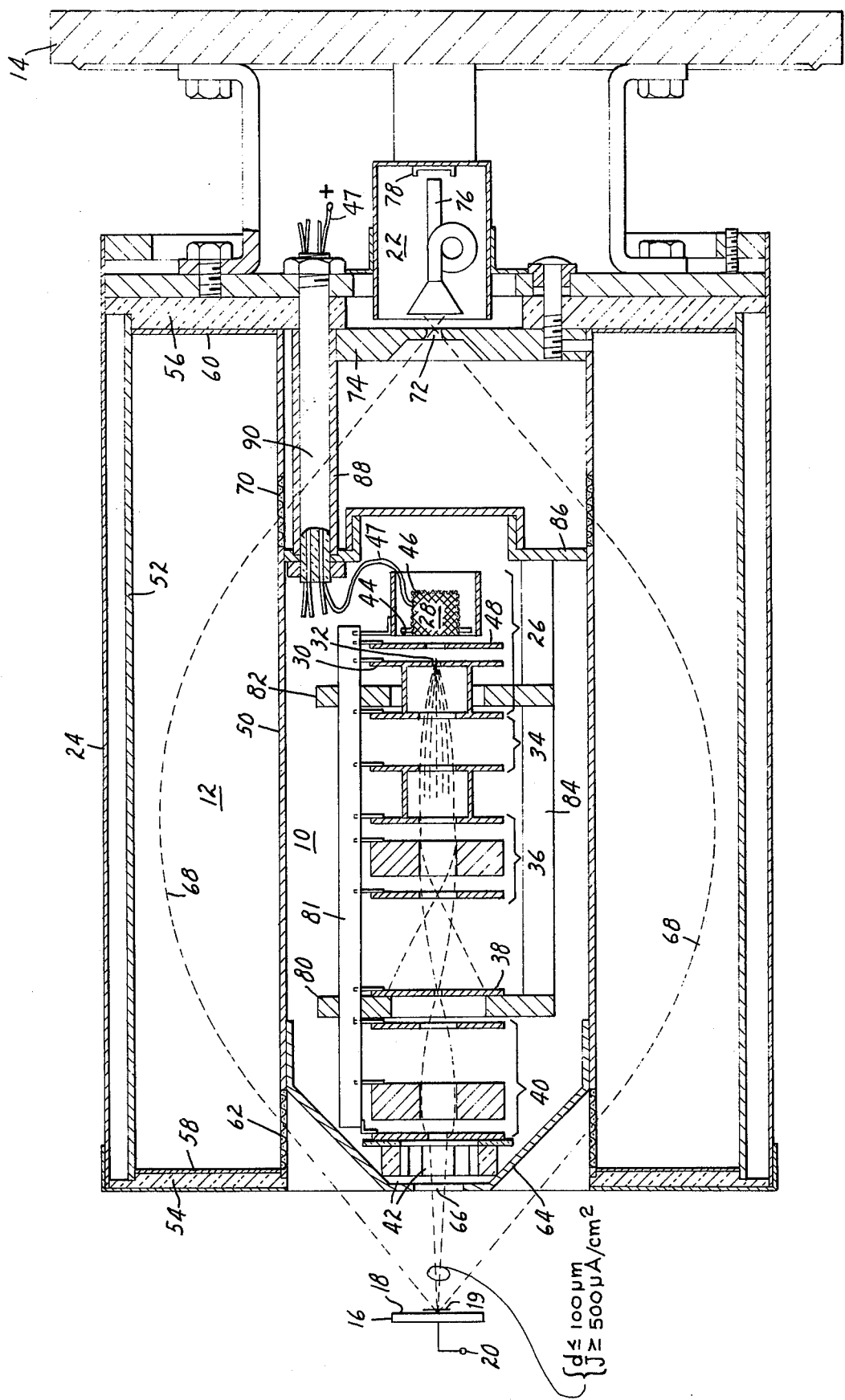
FIG. 1 is a cross section of one embodiment of the present invention.

FIG. 1 is a cross section of an ion scattering spectrometer according to a preferred embodiment of the present invention, including an ion beam producing means such as an electron bombardment type ion gun shown generally as 10 and a cylindrical mirror analyzer 12. These members are mounted on a standard vacuum flange 14 such that the device may be inserted into a conventional high vacuum system (not shown). A target 16 having a surface 18, an area 19 of which is to be analyzed is positioned within the vacuum system in axial alignment with the axis of the gun 10 and the analyzer 12. A terminal 20 is also provided on the target 16 such that the target may be maintained at a desired electrical potential. Axially mounted at the opposite end of the analyzer 12 proximate the conjugate focal point of ions scattered from the target is a detecting means 22. The entire assembly is enclosed in a stainless steel shroud 24 which serves primarily as an electrostatic shield for the analyzer. A substantial portion of the present invention was disclosed but not claimed in copending patent application Ser. No. 669,091, filed Mar. 22, 1976. The inventor of the present invention is one of the coinventors of the invention there claimed.

The ion gun 10 is substantially the same as that recited and claimed in U.S. Pat. No. 3,937,958, the disclosure of which is incorporated herein by reference. This gun is generally of the electron bombardment type and includes an ion generating portion 26 having a source of ions shown generally as 28 and a primary extractor electrode 30 having an aperture 32. The aperture 32 controls the passage of ions from the source and thus defines the effective diameter of the generated beam. Sequentially positioned downstream of the generator 26 is an acceleration section shown generally as 34, a first focusing lens 36, a diameter limiting electrode 38, a second focusing lens 40 and deflection electrodes 42. The ion generator portion 26 includes a source of electrons 44, an electron permeable cylindrical grid 46 and a supplemental extractor electrode 48. The electron source 44 is a cylindrical single turn filament which encircles the cylindrical grid 46 and which lies in a plane approximately normal to the axis of the beam.

As set forth in U.S. Pat. No. 3,937,958, upon evacuation of the chamber (not shown) in which the above-described apparatus is positioned, and backfilling the evacuated chamber with a partial pressure of a noble gas, the application of suitable potentials to the various portions of the gun 10 causes gas within the cylindrical grid 46 to be ionized. I.e., when the grid 46 is biased electrically with respect to the source of electrons 44, such as by a positive potential connected to lead 47, electrons are attracted into a chamber defined by the grid 46 and impinge upon and ionize atoms therewithin. A high potential on the entire source assembly 28 and a suitable intermediate potential on the extraction electrode 30 causes the ions to enter the first lens 36, the first element of which is generally at ground potential, in substantially parallel trajectories. These ions are subsequently focused by the first and second focusing lenses 36 and 40, respectively, so as to cause a focused beam to impinge upon the target 16. Such a gun has been found to provide a high brightness beam which preferably has a minimum diameter ($d$) at the target of not greater than approximately 100 micrometers and a current density ($J$) of not less than approximately 500 microamps per $cm^2$. The deflection plates 42 which when energized by a deflection power supply (not shown) cause the beam to be orthogonally scanned or positioned anywhere across an analysis area on the target surface over which the analyzer exhibits substantially constant sensitivity and resolution.

The cylindrical mirror analyzer 12 is constructed to have inner and outer concentric cylindrical electrodes 50 and 52, respectively. These electrodes are formed of stainless steel tubing in a conventional manner. The ends of the cylinders are positioned in ceramic endplates 54 and 56 so as to maintain the desired concentricity, which endplates in turn are contained by the shroud 24. The ceramic endplates 54 and 56, in addition to being shaped to receive the cylindrical electrodes 50 and 52, are provided with resistive coatings 58 and 60 on the inward facing surfaces. The resistive coatings prevent the development of localized fields due to charging of the endplates 54 and 56 and provide for a field gradient between the inner and outer electrodes in the region of the endplates 54 and 56 which is substantially identical to that provided by infinitely long electrodes. Such a configuration minimizes degradations in the analyzer performance and greatly facilitates the theoretical design of the analyzer. Such a potential results in a zone of substantially radial electric field between the inner and outer electrodes 50 and 52 respectively. The analyzer 12 is preferably adapted to provide an analysis area on the target surface of not less than one thousand times the area of the ion beam impinging thereon, and to exhibit substantially constant sensitivity and resoluton over that area. Such a capability enables the ion beam to be scanned over the analysis area and an elemental image of the scanned area thereby produced. Additional details of such an imaging configuration are provided in U.S. Pat. Nos. 3,916,190 and 3,916,191.

The analyzer 12 is provided with an entrance section which includes an annular entrance aperture 62 in the wall of the inner cylinder 50. The aperture is fitted with a fine mesh metal screen to provide an equipotential surface across the aperture 62 through which the ions enter into the radial field zone. This surface suppresses field distortion in the radial field zone and ensures the presence of a region adjacent the target surface which is free of fields associated with potentials applied within the analyzer. The surface of the target 16 is positioned with respect to the aperture 62 such that ions scattered through about 138° from the axis of the ion beam are allowed to pass through the aperture 62. Preferably, the entrance section additionally includes a second cylindrical metal screen (not shown) which is positioned proximate to and electrically insulated from the first screen, thus forming a region between the two screens in which a field may be generated by the application of potentials to the screens. This controls the energy of ions passing through the entrance section.

In order to provide additional control of the fields between the surface 18 of the target 16 and the first screen, it is desirable to provide parallel electrodes such that no substantially non-radial field gradients with respect to the point of impingement exist in this region. Accordingly, a third metal screen (also not shown) may be interposed between the first and second screens, which third screen is electrically connected to the first screen, the second and third screens being concentric to and substantially parallel to each other. To provide uniform radial fields between the screens, it is desirable that the second and third screens have a common center point located where the primary ion beam impinges on the target surface. The second screen may be provided with an axially centered aperture through which the incident ion beam passes to impinge upon the surface 18 of the target 16. A truncated cone 64 having an axial opening 66 through which the incident ion beam may pass provides an electric shield to prevent fields from the deflection electrodes 42 from penetrating into the field free region adjacent the target surface.

Ions scattered from the surface 18 of the target 16 enter the radial field zone between the inner and outer cylinders 50 and 52 along trajectories 68, and under the control of potentials applied between the inner and outer electrodes pass to the exit section of the analyzer. This section includes an annular exit aperture 70 through the wall of the inner electrode 50, thereby allowing ions along the trajectories 68 to pass through the aperture and toward the exit from the analyzer. The aperture 70 is fitted with a metal screen which assumes the potential of the inner cylindrical electrode 50 to provide an equipotential surface across the aperture 70 through which the ions exit and thereby further suppress field distortion in the radial field zone. This equipotential surface also ensures the presence of a region adjacent the conjugate focal point at an energy resolving aperture 72 which is free of fields associated with potentials applied within the analyzer. The exit section desirably includes another metal screen (not shown) axially symmetric and proximate to but electrically insulated from the screen over the aperture 70, forming an axially symmetric aperture through which ions may pass and by which an electrostatic field may be established in order to control the energy of ions subsequently passing through the energy resolving aperture 72. A third metal screen (also not shown) electrically connected to the first screen may also be interposed between the first and second screens. The latter two screens are preferably concentric spherical sections, having a common center point located at the axially positioned energy resolving aperture 72. In this way, the applied field substantially alters only the energy, but not the trajectories of the ions passing through the aperture 72. The aperture 72 is also located at the conjugate focal point of the target surface 18. The aperture 72 allows ions along the trajectory 68 to cross over in the plane of the aperture plate 74 and thereafter enter the detector 22.

The detector 22 includes a continuous channel electron multiplier 76 and an electron collector 78. The output of the collector is coupled to suitable display apparatus, such as through a capacitor and pulse amplifier.

In one embodiment, the exit aperture plate 74 and the entrance to the channel multiplier 76 are both maintained at ground potential, with the output of the multiplier 76 biased at several thousand volts positive potential. The electron collector 78 is similarly biased at a positive potential such that the output electronic signal generated in the collector 78 is capacitively coupled. In this embodiment, the target 16 and the inner cylinder 50 can be maintained approximately at ground potential. In order to analyze scattered ions over a range of ion energies from 0 to 2.5 KeV, the potential on the outer electrode 52 is sequentially varied over a range of potentials from 0 to 1.25 KV by an analyzer power supply (not shown).

As noted hereinabove, the ion gun 10 and analyzer 12 are adapted to be mounted on a standard high vacuum system flange 14. Individual elements of the gun 10 are mounted on insulating rods, one of which 81 is shown, and which are supported by members 80 and 82. The supports 80 and 82 are affixed to rods, one of which 84 is shown mounted on a base member 86 which thus supports the entire gun assembly. The base member 86 is joined to three grounded metal tubes, one of which 88 is shown. Electrical leads to the various electrodes of the gun are passed through insulating rods 90 which are enclosed in the grounded tubes 88. Fringing fields which would otherwise result from the application of potentials to such leads are thus shielded and prevented from producing perturbations in the ion trajectories in the field free regions. Such a compact construction minimizes the loss of signal resulting from the mechanical interception of ions by the support and electrical feedthrough members along the trajectory 68.

Figure 2:
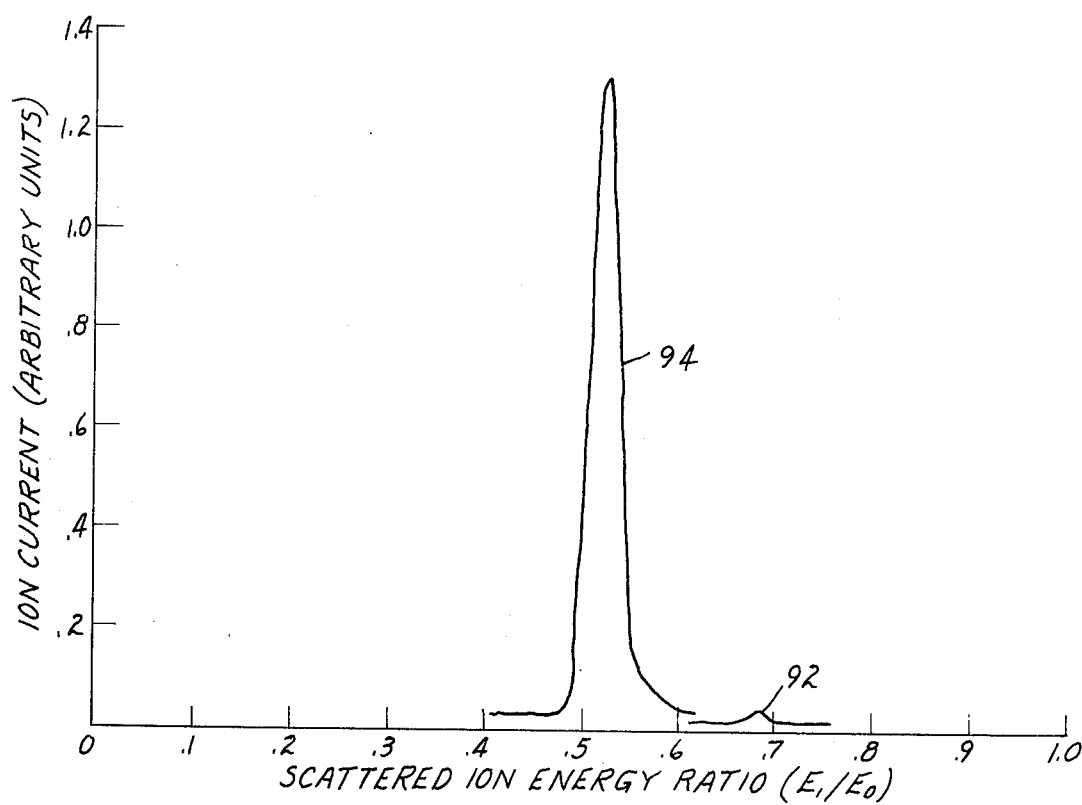
FIGS. 2–4 are spectra obtained with the device of the present invention.
Figure 3:
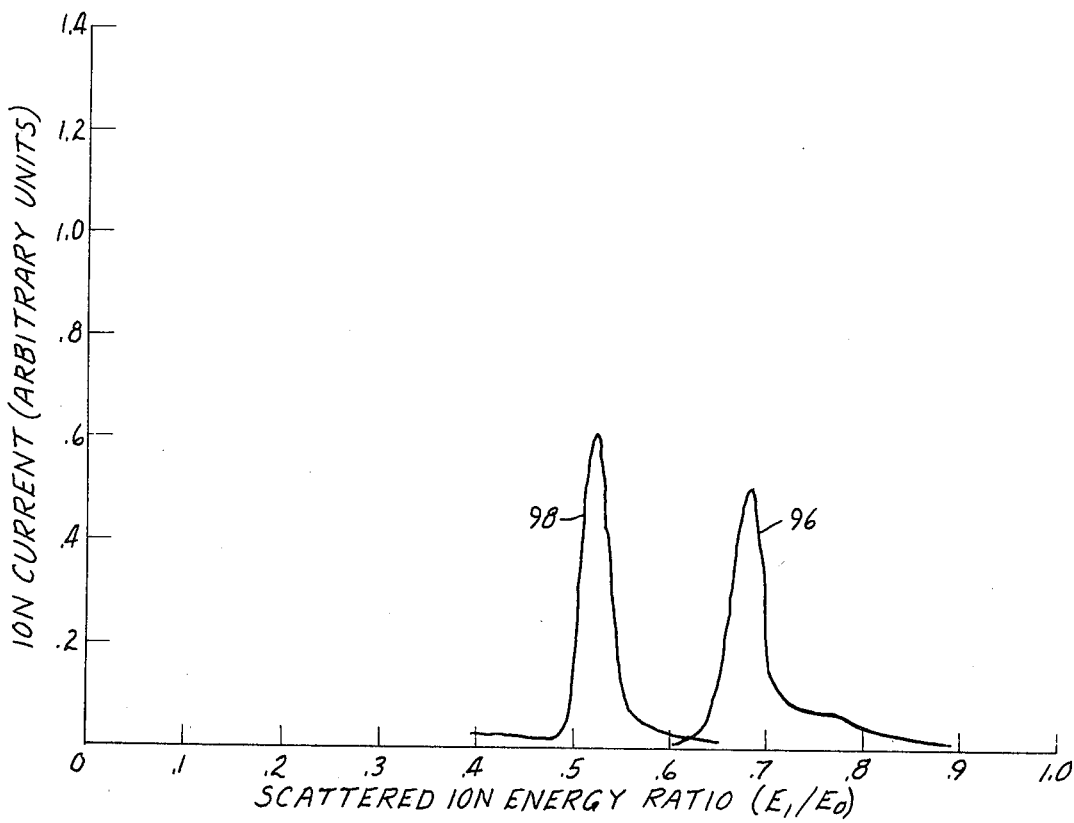
Figure 4:
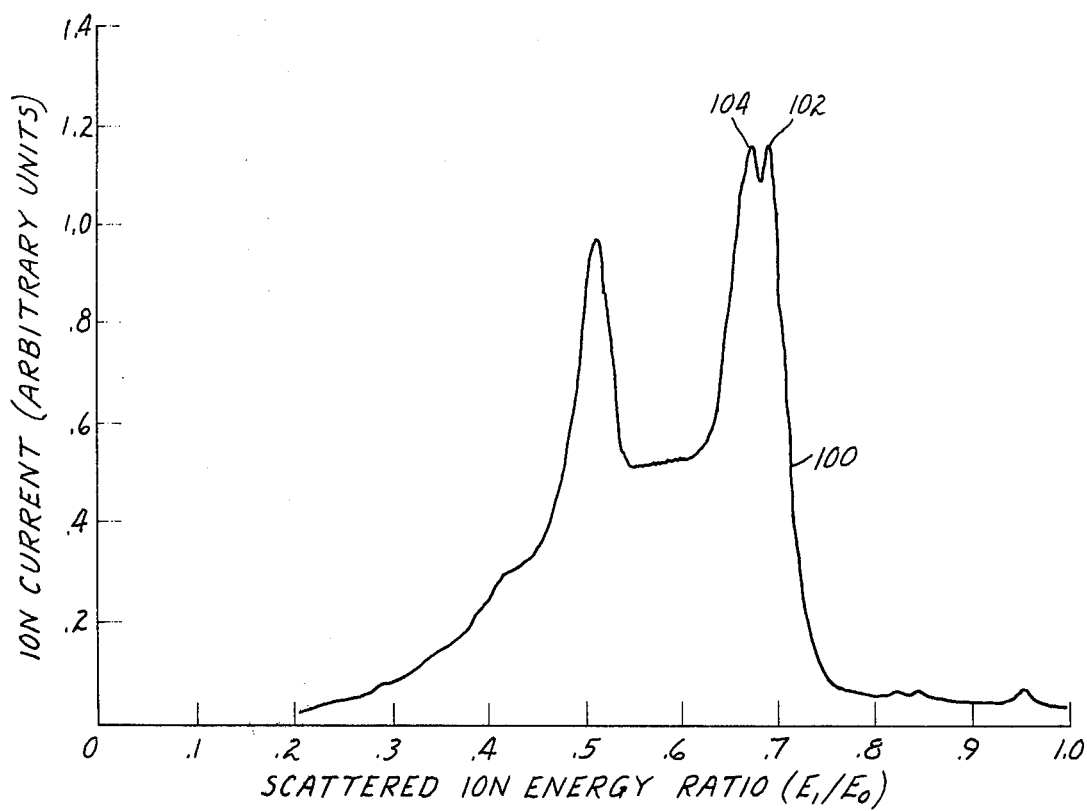

The advantages gained by the ion scattering spectrometer of the present invention are readily appreciated from the spectra set forth in FIGS. 2–4. In FIG. 2, spectra obtained with the prior art ISS, such as disclosed in U.S. Pat. No. 3,665,182, and with the ISS of the present invention are compared. In obtaining both spectra, 2.5 KeV beams of Ne ions of comparable ion currents were directed to silver targets. The amplitude of the right hand spectra 92 is indicative of the relative sensitivity obtained with the prior art ISS. In contrast, the left hand spectra 94 was obtained with the ISS of the present invention and indicates a gain in overall sensitivity in excess of 100. This gain in sensitivity as well as a gain in resolution is achieved despite a decrease in the quantity of scattered ions at large scattering angles. It may also be noted that the ratio of $E_i/E_o$ at which the scattered ion peak appears is offset, due to the change from 90° scattering, as in the prior art ISS, to the 138° scattering angle provided in the ISS of the present invention.

FIG. 3 present additional comparative spectra obtained from the prior art ISS and with the ISS of the present invention under the same conditions as that shown in conjunction with FIG. 2. The right hand spectra 96 was obtained from the prior art ISS, and was prepared with increased gain to better reveal the spectral shape. It may be noted that that spectra contains a high energy "tail" which is absent in the left hand spectra 98 obtained from the ISS of the present invention. The improved spectra in which the high energy "tail" is eliminated is believed to result from the reduction in the number of multiple scattering events that are observed to a greater extent at smaller scattering angles.

FIG. 4 is illustrative of the enhanced resolution obtainable with the ISS of the present invention. Prior art ISS has heretofore been unable to resolve adjacent elements such as Al and Si (27 and 28 AMU, respectively). I.e., spectra obtained from samples containing both elements exhibited but a single peak. In contrast, spectrum 100 was obtained with the ISS of the present invention. In obtaining this spectrum, a 2 KeV beam of 4 He ions was directed onto a surface of a Si wafer having an Al printed circuit deposited thereon. As may be seen, both Si and Al peaks, 102 and 104, respectively, are readily individually identifiable.

In addition to the advantages provided by the present invention as exemplified in the spectra shown in FIGS. 2–4, a number of additional advantages exist. For a number of reasons, it is desirable to have a large ratio of the analysis area, i.e., the area over which the resolution and sensitivity of the analyzer is substantially constant, to the cross sectional area of the ion beam. In such a case, the analyzer is always sensitive to the entire area being illuminated by the beam. Consequently, peak height comparisons between spectra can be made with a greater degree of confidence than has been previously possible. The increased accessible area further makes it possible to raster the beam across the analysis area and to generate a flat bottomed crater. The signal derived from the scattered ions can thereupon be electronically gated so as to eliminate information originating from the crater walls and in this way, increases the accuracy of depth profiles. Finally, elemental images of the accessible area can be generated by rastering the beam and synchronously displaying the detected current corresponding to a particular surface element. The large ratio of analysis area to beam diameter thus provided by the device of the present invention makes the depth profile analysis and elemental imaging applications, such as disclosed in U.S. Pat. Nos. 3,916,190 and 3,916,191 more commercially practicable.

The larger sactttering angle of 138° as utilized in the device of the present invention as opposed to the 90° scattering angle typically utilized in prior art ISS systems, are also beneficial in a number of other ways. At the larger scattering angle, the relation between surface atom mass and the scattered ion energy ratio is more nearly linear. This results in a greater separation in adjacent peaks at the high mass end where the prior art systems exhibited the smallest amount of mass resolution. Similarly, this high scattering angle combined with the axially symmetric scattering geometry provided in the device of the present invention decreases the effect of surface topography on the analysis. The high scattering angle results in less shadowing of the incident beam and the scattered beam as well as the decreased multiple scattering of incident ions as demonstrated in the comparative spectra shown in FIG. 3. Furthermore, the large scattering angle results in the analysis of more nearly back-scattered ions and results in less critical positioning of the sample. Also, the greatly enhanced sensitivity enables spectra to be obtained much more rapidly, thus expanding ISS analysis to quality control applications. Alternatively, a much less intense beam may be used to analyze easily damaged surfaces.

Having thus described the present invention, what is claimed is:

1. A device for analyzing a surface layer by means of ion scattering spectroscopy comprising (a) means for producing a beam of primary ions having substantially a single mass and single energy directed along an axis of symmetry toward a target placed at a predetermined position on the axis, the surface of which target is to be analyzed;

(b) a cylindrical mirror analyzer comprising inner and outer cylindrical electrodes electrically insulated from each other and coaxially disposed about said axis, one of which electrodes is positioned inside the other to define a zone of substantially radial electric field therebetween when a potential is applied between the electrodes, the inner cylindrical electrode having means providing an annular entrance aperture positioned to allow ions scattered from said surface at a predetermined angle to enter into the radial field zone and to be deflected thereby, and means providing an exit annular aperture positioned to allow the deflected ions to pass therethrough out of the radial field zone whereupon those ions having a preselected energy are focused upon an axially located conjugate focal point for ions scattering from the target; and (c) detector means for determining the ion current of such scattered ions as have said preselected energy, wherein the ion beam producing means comprises an electron bombardment type ion source in which the generation and extraction of ions in said ion beam is accomplished in the absence of magnetic fields, said ion source including means for supplying electrons into said ionization chamber and a plurality of substantially cylindrical members for extracting said ions from said chamber and for accelerating and focusing said extracted ions into an axially directed beam, all of which ion source members are axially positioned within the inner cylindrical electrode of the analyzer, the analyzer further comprises an exit aperture plate positioned normal to the axis and substantially enclosing the end of the inner cylinder adjacent the exit annular aperture and having an energy resolving aperture at said conjugate focal point and the detector means comprises an ion detector axially positioned adjacent the energy resolving aperture to receive ions passing therethrough, whereby the axial placement of the ion source within the analyzer enables the device to be compact, readily retrofitted into pre-existing apparatus while also enabling the ready production of an ion beam which can be focused onto a target and deflected onto selected portions of the target, and also enables the placement of said ion detector adjacent the said energy resolving aperture such that scattered ions of a selected energy which are focused by the analyzer through a cross-over point at the conjugate focal point, thereby maximizing the resolution of the analyzer, impinge onto the detector.

2. A device according to claim 1, wherein the ion beam producing means comprises a plurality of substantially cylindrical members including, in axial sequence, an ion source and a primary extractor electrode, followed by a first focusing lens, a diameter limiting electrode and a second focusing lens.

3. A device according to claim 2, wherein the ion beam producing means includes means for causing ions exiting said extractor electrode to enter said first focusing lens in substantially parallel trajectories and to be subsequently focused by said first and second lens to produce a high brightness ion beam having a minimum diameter at the target of not greater than approximately 100 micrometers and a current density of not less than approximately 500 microamps per $cm^2$.

4. A device according to claim 2, wherein the ion source comprises a source of electrons, an electron permeable grid which when biased electrically with respect to the source of electrons attracts electrons into a chamber within the grid to impinge upon and ionize atoms therewithin.

5. A device according to claim 1, further comprising means for supporting the cylindrical electrodes and ion beam producing means therewithin including means for passing electrical leads through insulating rods enclosed in grounded support members to prevent fringing fields produced by voltages in said leads from perturbing the ion trajectories in said field free regions.

6. A device according to claim 1, wherein the ion beam producing means further comprises means for scanning the ion beam in at least two directions across an analysis area on the target surface.

7. A device according to claim 6, wherein the ion beam producing means includes means for generating a substantially monoenergetic beam which can be focused to a very small diameter spot of not greater than approximately 100 micrometers under one set of operating conditions, and can be deflected by said scanning means over said target surface a distance from said axis in said at least two directions at least 1.5 mm to thereby define a said analysis area on the target surface which is generally centered about said axis and which is not less than one thousand times the area of the ion beam impinging thereon, over which analysis area the sensitivity and resolution of the analyzer is subsantially constant, such that beams may be scanned over said area and an elemental image of the scanned area produced.

8. A device according to claim 1, wherein the entrance and exit apertures are provided with metal screens through which ions may pass and which enable the application of an elecrical potential thereto to establish an equipotential surface across the apertures.

9. A device according to claim 1, wherein the analyzer includes end plates supporting the cylindrical electrodes, said end plates having resistive surfaces facing the radial field zone such that a potential applied between the inner and outer electrodes is distributed across the resistive surfaces to provide a field gradient between the inner and outer electrodes in the region of the end plates.

10. A device according to claim 1, further comprising means for supporting the respective members of the device on a flange adapted to cooperate with high vacuum type devices to enable analysis by ion scattering spectroscopy of surfaces within said high vacuum type devices.

* * * * *